United States Patent
Cheng et al.

(10) Patent No.: US 6,479,872 B1
(45) Date of Patent: Nov. 12, 2002

(54) DYNAMIC SUBSTRATE-COUPLED ELECTROSTATIC DISCHARGING PROTECTION CIRCUIT

(75) Inventors: Tao Cheng, Kaushung County (TW); Jian-Hsing Lee, Hsin-Chu (TW); Lin-June Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/221,959

(22) Filed: Dec. 28, 1998

(51) Int. Cl.$^7$ .............................................. H01L 23/62
(52) U.S. Cl. ...................... 257/360; 257/358; 257/363; 257/365
(58) Field of Search ................................ 257/360, 358, 257/363, 355, 315

(56) References Cited

U.S. PATENT DOCUMENTS

| | | | |
|---|---|---|---|
| 5,173,755 A | 12/1992 | Co et al. ..................... | 257/361 |
| 5,477,078 A | 12/1995 | Beigel et al. ............... | 257/606 |
| 5,486,716 A | 1/1996 | Saito et al. ................. | 257/360 |
| 5,528,188 A * | 6/1996 | Au ............................. | 257/363 |
| 5,631,793 A | 5/1997 | Ker et al. .................... | 361/56 |
| 5,670,814 A * | 9/1997 | Wu et al. ................... | 257/360 |
| 5,686,751 A * | 11/1997 | Wu ............................ | 257/355 |
| 5,907,462 A * | 5/1999 | Chatterjee ................... | 257/355 |
| 6,063,659 A * | 5/2000 | Le .............................. | 438/250 |
| 6,066,537 A * | 5/2000 | Poh ............................ | 438/393 |
| 6,072,677 A * | 6/2000 | Chen ........................... | 361/56 |
| 6,114,731 A * | 9/2000 | London ....................... | 257/355 |
| 6,121,104 A * | 9/2000 | Dierschke ................... | 438/382 |
| 6,146,939 A * | 11/2000 | Dasgupta .................... | 438/241 |

OTHER PUBLICATIONS

Duvvury et al., "ESD: A Pervasive Reliability Concern for IC Technologies", Proceedings of the IEEE, vol. 81, No. 5, 1993.

Amerasekera et al., "The Impact of Technology Scaling on ESD Robustness and Protection Circuit Design", EOS/ESD. Symposium 94–237 pp. 6.1.1–6.1.9.

Amerasekera et al., "Modeling MOS Snapback and Parasitic Bipolar Action for Circuit–Level ESD and High–Current Simulations", IEEE Circuits and Devices, vol. 13, No. 2, Mar. 1997, pp. 7–10.

Chen, "The Effects of Interconnect Process and Snapback Voltage on the ESD Failure Threshold of NMOS Transistors".

IEEE Transactions on Electron Devices, vol. 35, No. 12, Dec. 1988.

* cited by examiner

Primary Examiner—Olik Chaudhuri
Assistant Examiner—Nathan W. Ha
(74) Attorney, Agent, or Firm—George O. Saile; Stephen B. Ackerman; Billy Knowles (57) ABSTRACT

A dynamic source coupled ESD protection circuit that dissipates an ESD voltage coupled to an electrical contact pad to protect internal circuits on an integrated circuits chip is described. The ESD protection circuit lowers the snapback voltage of the ESD protection circuit to allow a thinner gate oxide within the internal circuits of the integrated circuit chip. The dynamic substrate coupled electrostatic discharge protection circuit consists of a gated MOS transistor, a capacitor, and a resistor. The gated MOS transistor has a drain region connected to the electrical contact pad. The gate and source are connected to a power supply voltage source. The power supply voltage source will either be a substrate biasing voltage or ground reference point for a gated NMOS transistor. The power supply voltage source will be the power supply voltage source $V_{DD}$ for the gated PMOS transistor. The capacitor has a first plate connected to the electrical contact pad, and a second plate connected to said substrate bulk region of the MOS transistor. The resistor is a polycrystalline silicon resistor that is connected between the second plate of the capacitor and the power supply voltage source.

9 Claims, 8 Drawing Sheets

DYNAMIC SUBSTRATE-COUPLED ELECTROSTATIC DISCHARGING PROTECTION CIRCUIT

BACKGROUND OF THE INVENTION

1. Field of the Invention

This invention relates to integrated electronic circuits. More particularly, this invention relates to circuits for protecting integrated circuits from damage caused by electrostatic discharge (ESD).

2. Description of Related Art

The electrostatic discharge (ESD) phenomena is well known in the art. As integrated circuit technologies have advanced, the destructive potential of ESD on VLSI chips has degraded the reliability of the VLSI chips. "ESD: A Pervasive Reliability Concern for IC Technologies," by Duvvury et al., Proceedings of The IEEE, Vol. 81, No. May 5, 1993, provides an overview of ESD. The major source of ESD events are contact by the human body to integrated circuits. A typical work environment will accumulate a charge of about 0.16 $\mu$C induced to a body capacitance of 150 pf. This will lead to electrostatic potentials of 4 kV or greater. When the human body makes contact to an object such as an integrated circuit, peak currents of many amperes may flow for time periods of about 100 ns. The level of energy dissipated in such discharges is sufficient to cause breakdown or rupture of the oxide isolations or burnout of interconnections.

"The Impact of Technology Scaling on ESD Robustness and Protection Circuit Design," by Amerasekera et al. (1), Proceeding EOS/ESD Symposium, 1994, pp. 237–245, discusses the concerns for protecting devices in deep submicron integrated circuit processes. These processes include thin oxides (40 Å–80 Å), small channel lengths (0.25 $\mu$m to 0.5 $\mu$m), shallow junctions (0.1 $\mu$m to 0.2 $\mu$m), and salicided diffusions. Further, as integrated circuit design has improved, the technologies have increased the number of input/output contact pads to greater than 300 and consequently the pad-to-pad spacing are now from 50 $\mu$m to 100 $\mu$m. The total area available for ESD protection circuits is now on the order of 2500 $\mu$m$^2$, thus requiring the ESD protection circuits to be highly efficient.

Figure 1A:
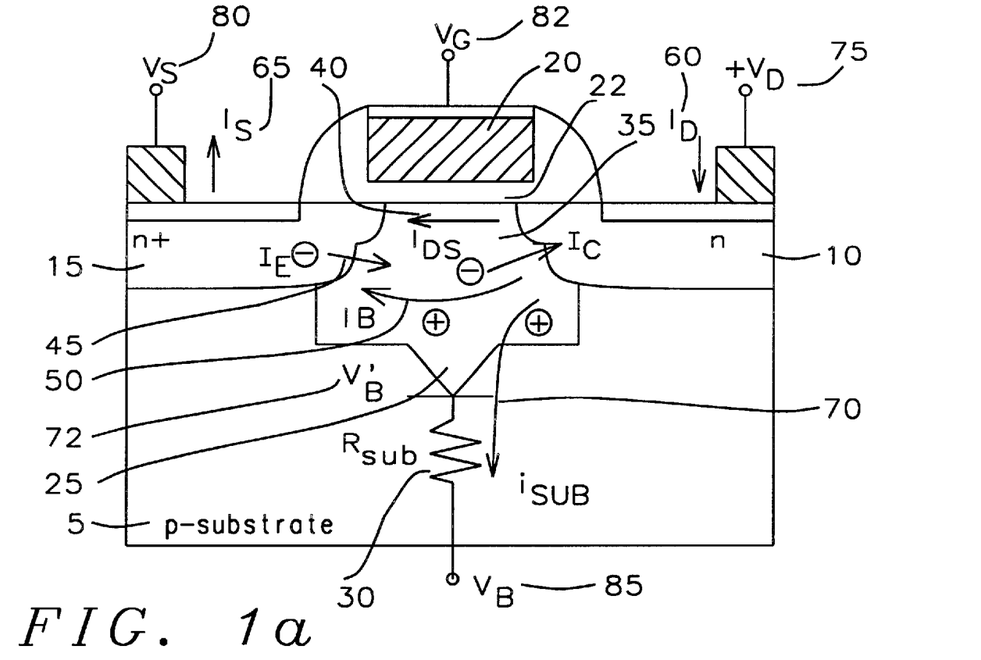
FIG. 1a is a cross-sectional diagram of an N-MOS transistor showing the current flows during avalanche breakdown and snapback.
Figure 1B:
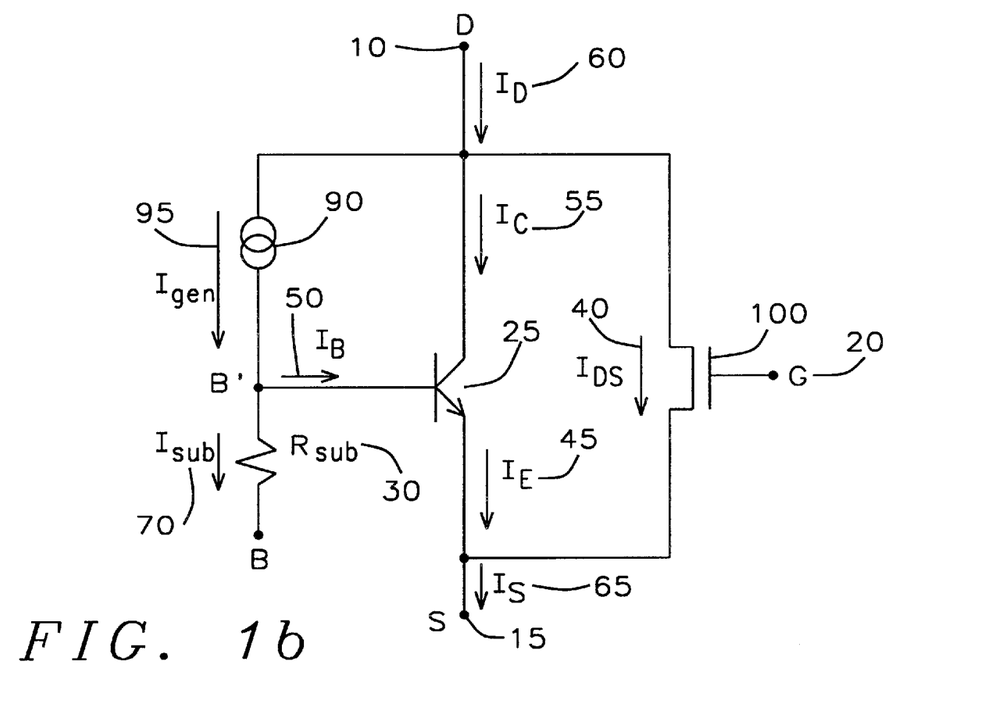

"Modeling MOS Snapback and Parasitic Bipolar Action for Circuit-Level ESD and High-Current Simulations," Amerasekera et al. (2), IEEE Circuits and Devices, Vol. 13, No. 2, Mary 1997, pp. 7–10, discusses mechanisms of operation of a metal oxide semiconductor (MOS) transistor. The MOS transistor as shown in FIGS. 1a and 1b has an N-type drain 10 and an N-type source 15 diffused into a P-type semiconductor substrate 5 a gate electrode 20 is formed of the surface of a gate oxide 22. The parasitic bipolar transistor 25 is formed by the drain 10, the source 15 and the substrate 5 of the MOS transistor. The drain 10 acts as the collect of the parasitic transistor 25. The emitter of the parasitic transistor 25 is the source 15. The region between the source 15 and the drain 10 is the base of the parasitic bipolar transistor 25. The bulk resistance of the P-type semiconductor substrate 5 is the base resistor $R_{sub}$ 30.

To characterize the performance voltage sources $V_D$ 75 is connected to the drain 10, $V_s$ 80 is connected to the source, $V_G$ 82 is connected to the gate 20, and $V_b$ 85 is connected to the P-type semiconductor substrates 5.

Figure 1C:
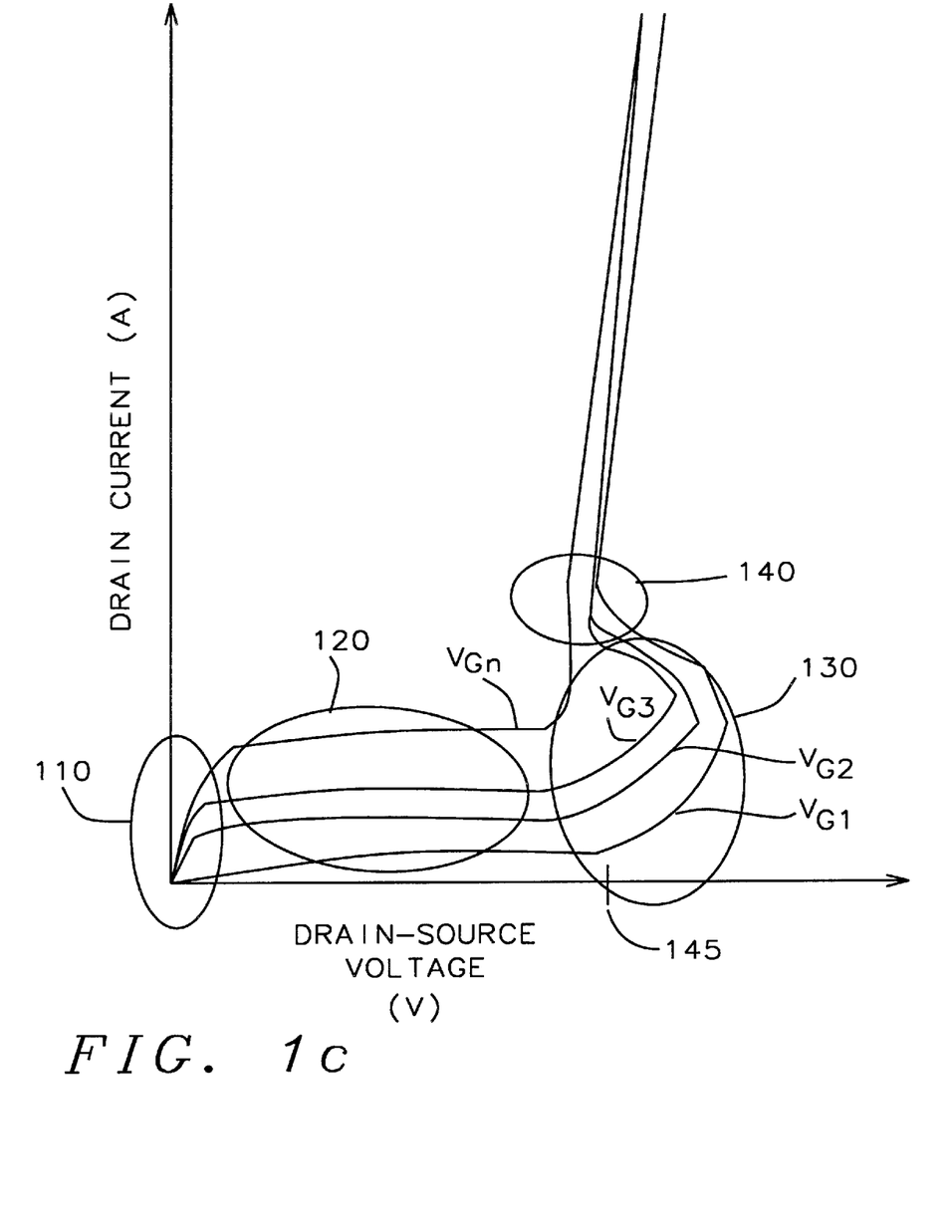

FIG. 1c shows a plot of drain current $I_D$ 60 versus the drain to source voltage ($V_D$-$V_s$) for various gate to source voltages ($V_G$-$V_s$) $V_{g1}$, $V_{g2}$, $V_{g3}$, $V_{gn}$. At the lower drain to source voltage ($V_D$-$V_s$) the MOS transistor will be operating in the linear region 110 or the saturation region 120. However, as the drain to source voltage ($V_{D-Vs}$) increases, the drain current ID 60 increases and the MOS transistor enters the avalanche region 130. Any further attempt to increase the drain to source voltage ($V_{D-Vs}$) will cause the MOS transistor to enter the snapback region 140. Any further attempt to increase the drain to source voltage will cause dramatic increase in the drain current $I_D$ 60. The mechanism involved in the operation involves both avalanche breakdown and the turn on of the parasitic bipolar transistor 25.

As the drain to source voltage ($V_D$-$V_s$) becomes sufficiently large, a high field region 35 near the drain generates a large amount of carries which result in a hole current $I_{sub}$ 70 into the substrate 5. The voltage drop across the substrate bulk resistance 30 raises the local substrate potential V'$_B$ 72. The voltage V'$_B$ 72 causes the source 15 to substrate 5 junction to become forward biased. Electrons 45 injected from the source 15 to the substrate 5 are collected at the drain 10. As the voltage drop across the substrate bulk resistance $R_{sub}$ 30 becomes greater than 0.8V, the lateral bipolar transistor 25 begins to turn on.

The substrate current $I_{sub}$ 70 is a function of the avalanche multiplication factor in the high field region 35 of the drain 10. The avalanche generation current $I_{gen}$ 95 provided by the current source 90 is a function of an incident current multiplied by the avalanche multiplication factor. If the gate voltage source $V_G$ 82 is zero, the incident current is due solely to thermal generation and minority carrier diffusion. As the drain to source voltage is increased to the avalanche breakdown voltage, the avalanche multiplication factor increases toward infinity.

A gate to source voltage $V_G$ 82 greater than the threshold voltage $V_{TH}$ of the MOS transistor will result in a drain to source current $I_{DS}$ 40. A lower avalanche multiplication factor can now sustain the substrate current $I_{sub}$ 70. Hence, the parasitic bipolar transistor 25 turns on at a lower drain to source voltage ($V_D$-$V_s$). The level of the drain to source voltage ($V_D$-$V_s$) at which the parasitic bipolar transistor will turn on is now a function of the gate to source voltage VG 82.

Figure 2:
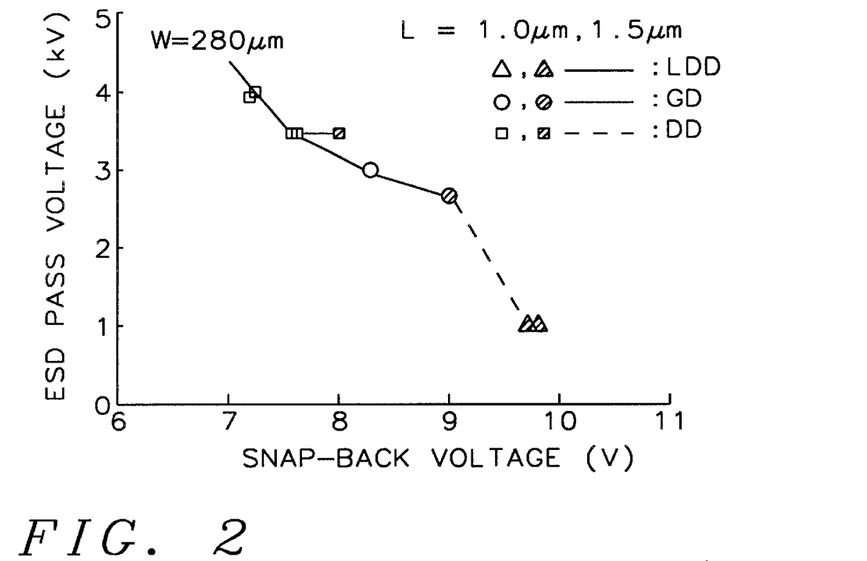
FIG. 2 is a plot of a maximum ESD voltage that a MOS transistor will survive versus the snapback voltage of the MOS transistor.

The snapback voltage 145 of FIG. 1c is the voltage level of the drain to source voltage ($V_D$-$V_s$) at which any increase in the drain to source voltage ($V_D$-$V_s$) causes an inordinate increase in the drain current $I_D$ 60. "The Effect of Interconnect Process and Snapback Voltage on the ESD Failure Threshold of N-MOS Transistors," by Chen, IEEE Transactions on Electron Devices, Vol. 35, No. Dec 12, 1988, discusses the function of the ESD pass voltage versus the snapback voltage of an N-MOS transistor. The ESD pass voltage is the level of an ESD voltage source modeled after human body at which an N-MOS transistor can sustain without damage. As shown in FIG. 2, for N-MOS transistors fabricated with lightly doped drain (LDD), Graded Drain (GD), or Double Diffused Drain (DDD), the ESD pass voltage is almost linearly dependent on the snapback voltage of the N-MOS transistor. This indicates that a lower snapback voltage provides enhanced protection for integrated circuits from an ESD event.

Traditionally, ESD protection circuits have consisted of the MOS transistor of FIG. 1a with the gate 20 connected directly to the source 15 and connected to a power supply voltage source that is either $V_{ss}$ or Ground. Alternately, the gate 20 connected to the drain 10 that is connected to the input/output contact pad. As discussed above, the snapback voltage is at a maximum value and the ESD pass voltage is at a minimum.

Amerasekera et al. (1) discusses gate coupled N-MOS ESD protection circuit. And N-MOS transistor has a drain connected to an input/output contact pad and a source connected to a substrate biasing voltage source $V_{ss}$. The gate of the N-MOS transistor is coupled through capacitor to the input/output contact pad and through resistor to the substrate biasing voltage source $V_{ss}$. When an ESD voltage source is connected to the input/output contact pad, the ESD voltage is coupled to the gate of the N-MOS transistor. The N-MOS transistor begins to conduct as described above and the snapback voltage is thus decreased.

U.S. Pat. No. 5,631,793 (Ker et al.) discloses a similar ESD protection circuit. The circuit consists of an N-MOS transistor configured as described above except the substrate bulk is additionally connected to the substrate biasing voltage source. The circuit further has a P-MOS transistor having a drain connected to the input/output contact pad and a source connected to a power supply voltage source $V_{DD}$. The gate of the P-MOS transistor is connected through a capacitor to the input/output contact pad and through a resistor to the power supply voltage source $V_{DD}$.

The anode of a first diode is connected to the input/output contact pad and the cathode of the first diode is connected to the power supply voltage source $V_{DD}$. The cathode of a second diode is connected to the input/output contact pad, with its anode connected to the substrate biasing voltage source $V_{DD}$.

The structure as described will provide protection for ESD voltage sources having positive and negative voltages relative to either the power supply voltage source $V_{DD}$ or the substrate biasing voltage source $V_{ss}$.

The operation of the N-MOS transistor is as described in Amerasekera et al. (1). The N-MOS transistor will have an identical response as above described except the polarities of the voltages are reversed. The diodes will provide protection when either the power supply voltage source $V_{DD}$ or the substrate biasing voltage source $V_{ss}$ are not connected or floating relative to the ESD voltage source. One of the diodes will conduct thus protecting the internal circuitry.

U.S. Pat. No. 5,173,755 (Co et al.) shows a capacitively coupled ESD protection circuit. The capacitively coupled ESD protection circuit employs a capacitor and a zener diode to trigger a thick oxide ESD shunt MOS transistor. When an ESD induced voltage that is connected to an input/output contact pad reaches the turn-on voltage determining by the zener breakdown voltage, the shunting MOS transistor is turned on by current coupled through the capacitor to the base of the parasitic bipolar transistor of the MOS transistor. The MOS transistor will turn on as described above to dissipate the charge from the ESD voltage source.

U.S. Pat. No. 5,528,188 (Au et al.) discloses an ESD protection circuit having a low voltage silicon controlled rectifier and a MOS transistor integrated together. A resistor-capacitor network coupled from the input/output contact pad to the gate of the MOS transistor will control the conduction of the MOS transistor. The MOS transistor will turn on the low voltage silicon controlled rectifier. The silicon controlled rectifier will turn on to shunt the ESD voltage to ground.

U.S. Pat. No. 5,486,716 (Saito et al.) teaches an open drain output N-MOS transistor having a strengthened ESD resistance. The N-MOS transistor has a channel structure to release ESD stress current by activating the parasitic bipolar transistor as described above.

U.S. Pat. No. 5,477,078 (Biegel et al.) discloses an ESD protective clamp device that is formed in an isolated chip cell of an integrated circuit. The ESD protective clamp device is a diode structure that is connected to an input/output contact pad to clamp an ESD voltage source to protect internal circuits of an integrated circuit.

SUMMARY OF THE INVENTION

An object of this invention is to provide an ESD protection circuit that dissipates an ESD voltage to protect internal circuits on an integrated circuits chip.

Another object of this invention is to provide an ESD protection circuit that is connected to an input/output contact pad of an integrated circuit chip.

Further, another object of this invention is to lower the snapback voltage of an ESD protection circuit to allow a thinner gate oxide within the internal circuits of the integrated circuit chip.

To accomplish these and other objects a dynamic substrate coupled ESD Protection Circuit is coupled to an electrical contact pad of an integrated circuit to dissipate electrostatic discharge voltage applied to the electrical contact pad. The dynamic substrate coupled electrostatic discharge protection circuit consists of a gated MOS transistor, a capacitor, and a resistor.

The gated MOS transistor has a drain region connected to the electrical contact pad. The gate and source are connected to a power supply voltage source. The power supply voltage source will either be a substrate biasing voltage or ground reference point for a gated NMOS transistor. The power supply voltage source will be the power supply voltage source $V_{DD}$ for the gated PMOS transistor.

The capacitor has a first plate connected to the electrical contact pad, and a second plate connected to the substrate bulk region of the MOS transistor. The insulator of the capacitor is the field oxide surrounding the gated MOS transistor.

The resistor is a polycrystalline silicon resistor that is connected between the second plate of the capacitor and the power supply voltage source.

When an ESD voltage is applied to the electrical contact pad, said ESD voltage is coupled through the capacitor to lower a snapback voltage of the MOS transistor by activating a parasitic bipolar device of said MOS transistor more quickly.

BRIEF DESCRIPTION OF THE DRAWINGS

FIG. 1b is a schematic diagram of the equivalent circuit of the N-MOS transistor of FIG. 1a.

FIG. 1c is a plot of the drain current versus the drain to source voltage for several gate to source voltages of the N-MOS transistor of FIG. 1a.

DETAILED DESCRIPTION OF THE INVENTION

Figure 3:
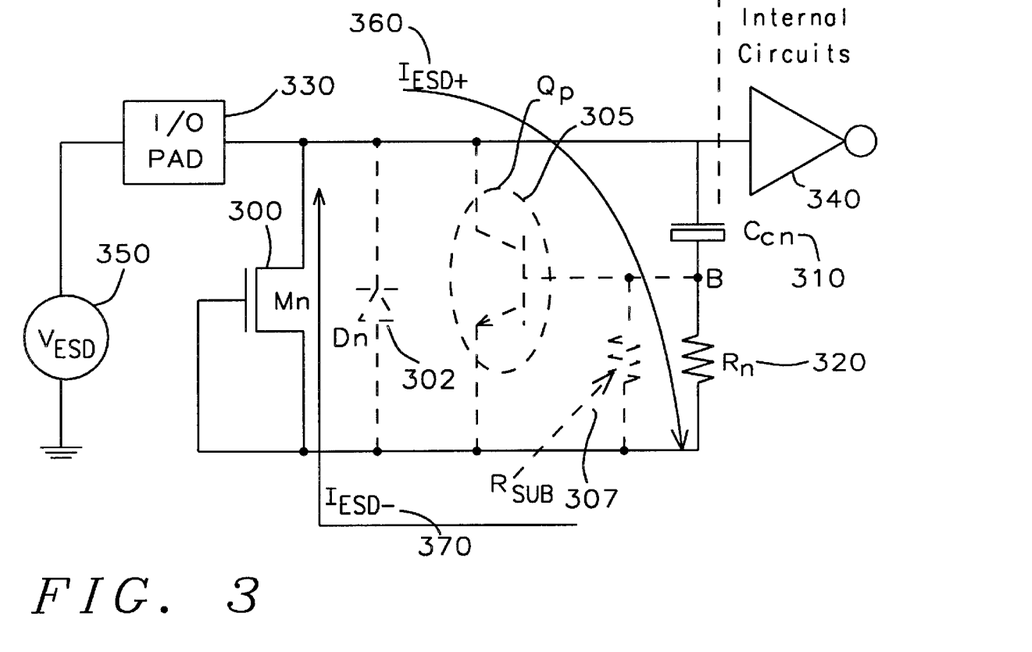
FIG. 3 is a schematic diagram of a first embodiment of the dynamic substrate coupled ESD protection circuit of this invention.

Refer now to FIG. 3 for a description of the first embodiment of the dynamic source coupled ESD protection circuit of this invention. The N-channel MOS (N-MOS) transistor $M_n$ 300 has a drain connected to the input/output contact pad 330 and a gate electrode connected to the source which is connected to the ground reference point. A coupling capacitor $C_{cn}$ 310 has a first plate connected to the input/output contact pad 330. A second plate of the coupling capacitor is connected to one terminal of a resistor $R_n$ 320. The second terminal of the resistor $R_n$ 320 is connected to the ground reference point.

The structure of the dynamic source coupled ESD protection circuit, which will be discussed in more detail hereinafter, has the parasitic transistor $Q_p$ 305. The collector of the parasitic transistor is the drain of the MOS transistor $M_n$ 300. The emitter of the parasitic transistor $Q_p$ 305 is the source of the MOS transistor $M_n$ 300. The parasitic resistor $R_{sub}$ 307 is the semiconductor bulk resistance of the semiconductor substrate on which the dynamic source coupled ESD protection circuit is formed. The diode $D_n$ 302 is formed by the junction between the drain of the MOS resistor $M_n$ 300.

When the positive ESD voltage source 350 is coupled to the input/output contact pad 330, the ESD voltage is coupled the coupling capacitor $C_{cn}$ 310. The voltage will be developed across the resistor $R_n$ 320 and the parasitic resistor $R_{sub}$ 307. Any ESD voltage larger than the threshold of voltage of the base-emitter junction of the parasitic bipolar transistor $Q_p$ 305 (approximately 0.8V) causes a base current sufficient to turn on the parasitic bipolar transistor $Q_p$ 305. The base current is sufficiently large to saturate the parasitic bipolar transistor $Q_p$ 305. If the magnitude of the charge present on the ESD voltage source 350 is large, the voltage present at the input/output contact will additionally force the MOS transistor $M_n$ 300 and the attendant parasitic bipolar transistor $Q_p$ 305 into the avalanche and snapback region described in FIG. 1c. Since the parasitic bipolar transistor $Q_p$ 305 is a saturated region of operation, the snapback voltage is lower than the operation described for FIGS. 1a and 1b.

During normal operation the data signal will have an amplitude of approximately 5.0V. The resistor $R_n$ 320 is designed such that it can discharge voltage coupled from a data signal during normal operation. However, during a period when the ESD voltage source 350 has a large voltage enough coupled voltage is sustained at the base of the parasitic bipolar transistor $M_n$ 300 by the resistor $R_n$ 320 and the parasitic resistor $R_{sub}$ 307 to turn on the parasitic bipolar transistor $Q_p$ 305.

If the ESD voltage present at the ESD voltage source 350 is negative, the parasitic diode $D_n$ 302 conducts to clamp the voltage present at ESD voltage source 350 to a voltage of one diode drop (0.8V) less than the ground reference point. This will allow a large amount of current $I_{ESD}$ 370 to pass from the ground reference point to the input/output contact 330. The speed at which the parasitic diode $D_n$ 302 conducts is sufficient to protect the internal circuitry.

The time required to turn on the parasitic bipolar transistor $Q_p$ 305 is determined by the capacitance of the coupling capacitor $C_{cn}$ 310 and the resistance of the resistor $R_n$ 320. The preferred value of the capacitor $C_{cn}$ 310 is approximately 0.06 pf and the preferred value of the resistor $R_n$ 320 is 80K ohms.

The time required to turn on the parasitic bipolar transistor should be sufficient to prevent the voltage at the input of the internal circuits 340 from being stressed by the ESD voltage.

Figure 4:
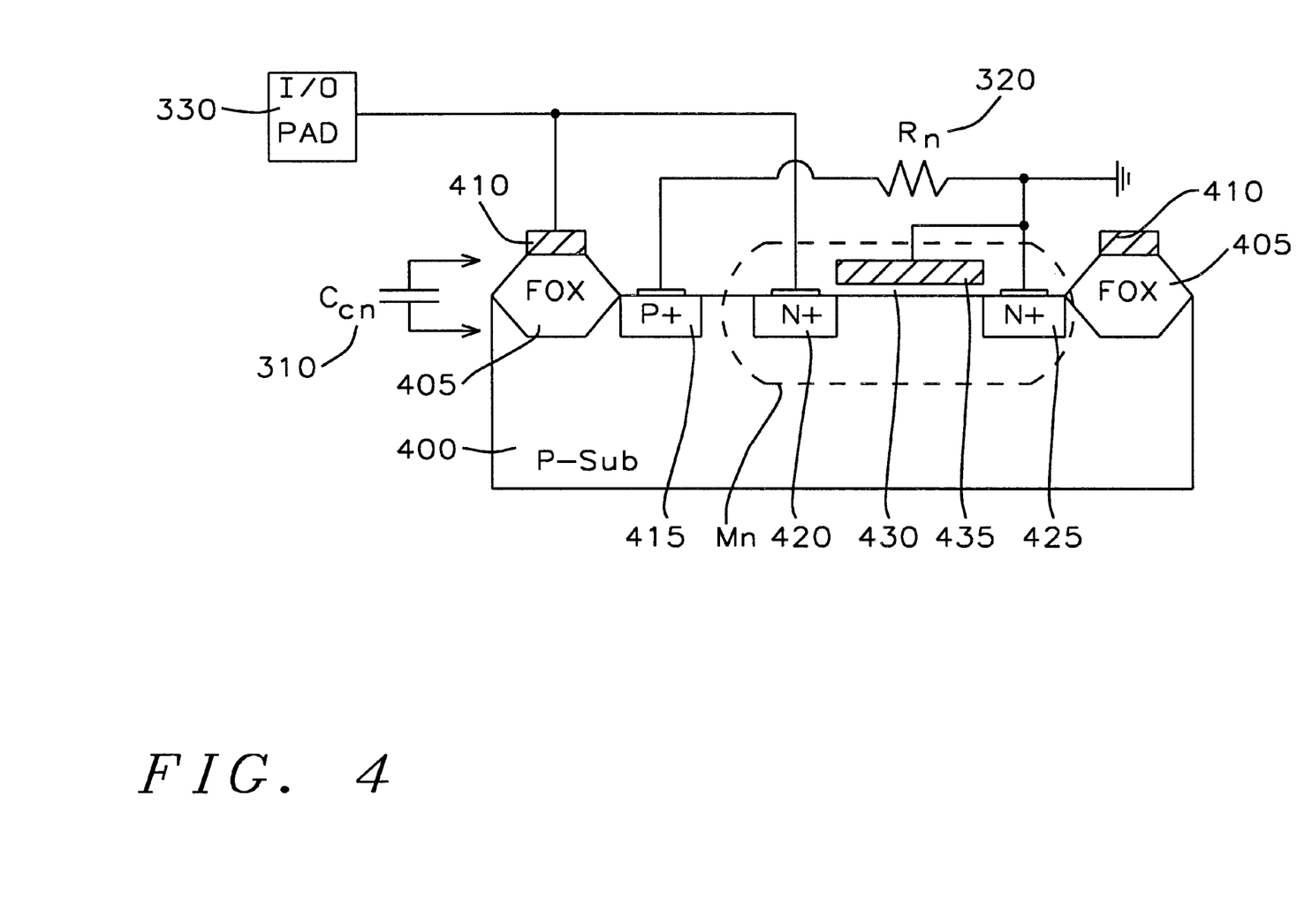
FIG. 4 is a cross-sectional view of the first embodiment of the dynamic substrate coupled ESD protection circuit of this invention.

Refer now to FIG. 4 for a discussion of the method to form the dynamic substrate coupled ESD protection circuit. On a provided P-type substrate a field oxide 405 is formed on the periphery of the area that contains the dynamic substrate coupled ESD protection circuit. Within the area, an N+ material is diffused into the surface of the P-type substrate 400 to form the drain region 420 and the source region 425 of the MOS transistor 300. A P+ material is diffused into the surface of the P-type substrate 400 to form a low resistance contact that is connected to the first terminal of the resistor $R_n$ 320. A gate oxide 430 is formed on the surface of the P-type substrate 400 between the drain region 420 and the source region 425. A conductive material such as polycrystalline silicon is formed on the surface of the gate oxide 430 to form the gate electrode 435. The conductive material is further formed on the top surface of the field oxide 405 to form the first plate 410 of the coupling capacitor $C_{cn}$ 310. The second plate of the coupling capacitor $C_{cn}$ 310 is the P-type substrate 400. The insulator of the coupling capacitor $C_{cn}$ 310 is the field oxide 405.

The first plate of coupling capacitor $C_{cn}$ 310 and the drain region 420 are connected to the input/output contact pad 330.

The second terminal of the resistor $R_n$ 320 is connected with gate electrode 435 and the source region 425 to the ground reference point. The resistor $R_n$ 320 is formed as the polycrystalline silicon sections 500 of FIG. 5.

Figure 6:
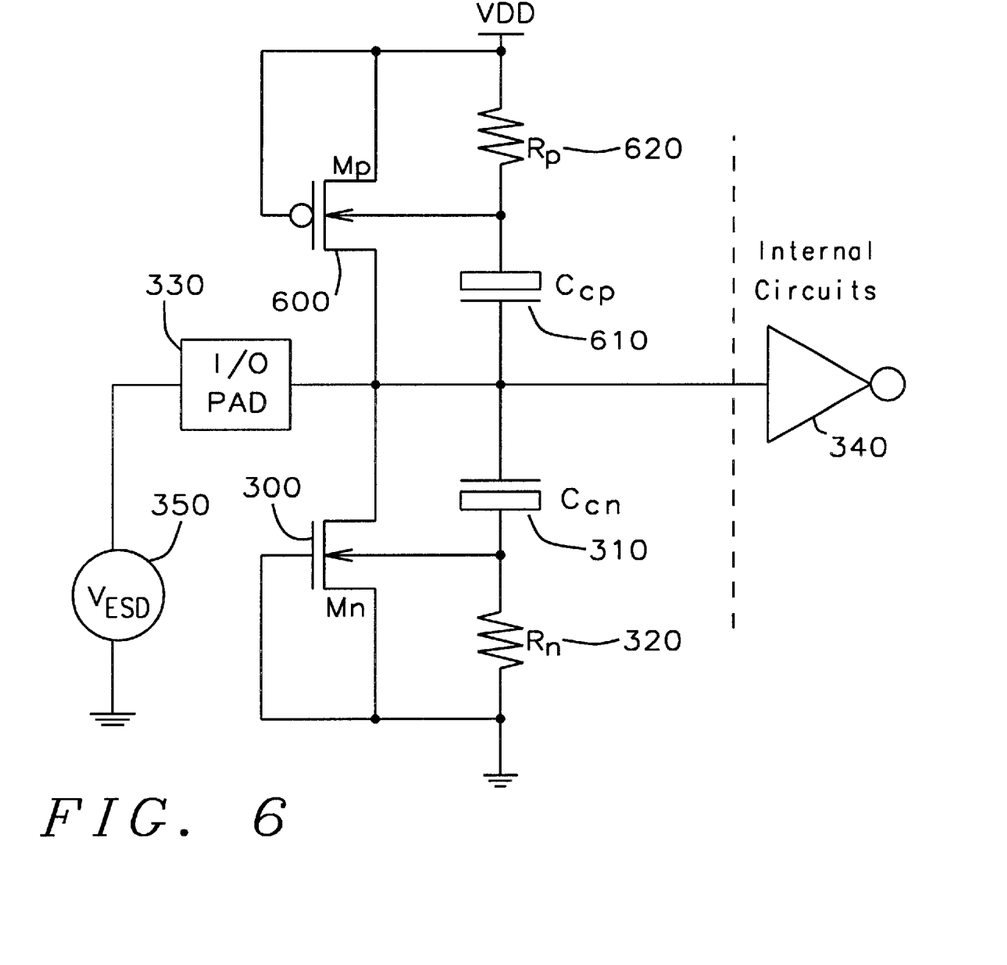
FIG. 6 is a schematic diagram of a second embodiment of the dynamic substrate coupled ESD protection circuit of this invention.

A second embodiment of a dynamic substrate coupled ESD protection circuit is shown in FIG. 6. The n-channel MOS transistor $M_n$ 300, the first coupling capacitor $C_{cn}$ 310 and the first resistor $R_n$ 320 are configured and function as described in FIG. 3. The p-channel MOS (P-MOS) transistor $M_p$ 600 has a drain connected to the input/output contact pad 330. The gate and drain of the P-MOS transistor $M_p$ 600 and the first terminal of the second resistor $R_p$ 620 are connected to the power supply voltage source $V_{dd}$.

The first plate of the second coupling capacitor $C_{cp}$ 610 is connected to the input/output contact pad 330. The second plate of the coupling capacitor $C_{cp}$ 610 and the second terminal of the second resistor are connected together and connected to the bulk of the P-MOS transistor $M_p$ 600.

The structure of the P-MOS transistor $M_p$ 600, the second coupling capacitor $C_{cp}$ 610 and the second resistor $R_p$ 620 as described function as described for FIG. 3 except the polarity of the ESD voltage source is negative. The negative voltage of the ESD voltage coupled to the input/output contact pad 330 is transferred through the second coupling capacitor $C_{cp}$ 610 to the base of the parasitic PNP bipolar transistor formed by the drain, source and the well of the P-MOS transistor $M_p$ 600. The voltage will cause a current through the second resistor $R_p$ 620 and the parasitic resistor formed by the well of the P-MOS transistor M$_p$ 600. As described above, the parasitic PNP bipolar transistor is turned on and driven into saturation thus dissipating the charge of the ESD voltage source V$_{ESD}$ 350 and protecting the internal circuits 340 from damage.

Figure 7:
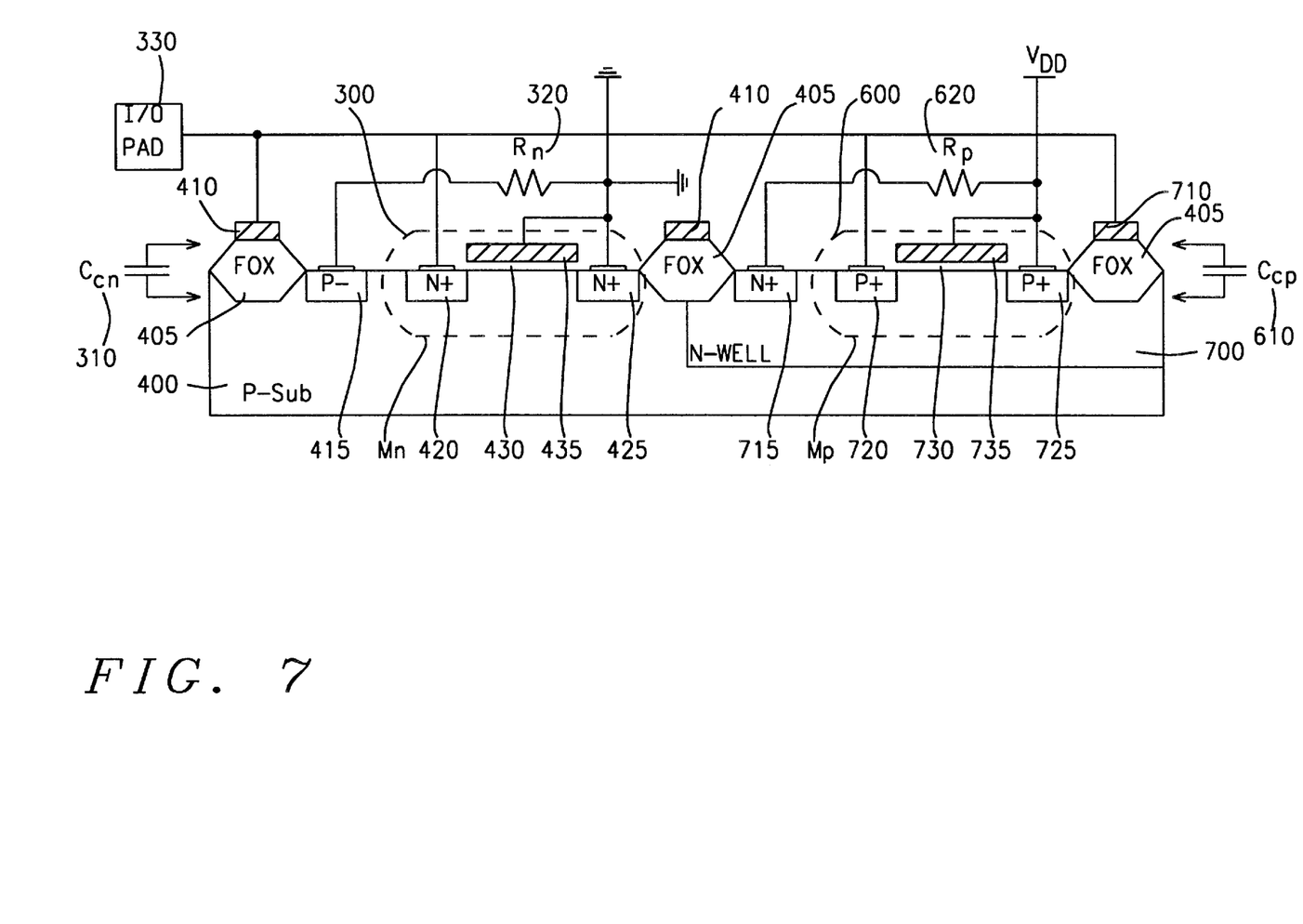
FIG. 7 is a cross-sectional view of the second embodiment of the dynamic substrate coupled ESD protection circuit of this invention.
Figure 8:
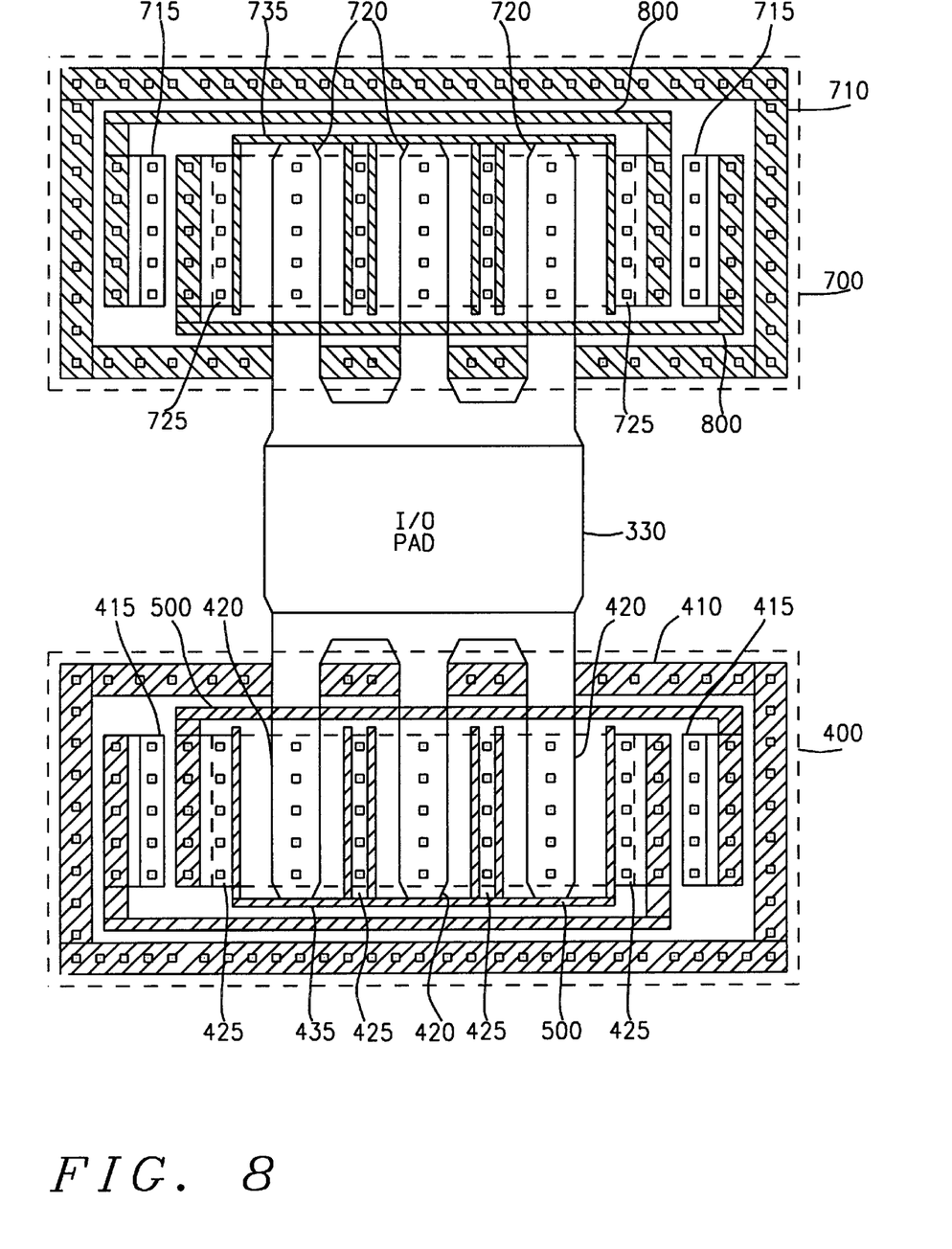
FIG. 8 is a top surface plan view of the second embodiment of the dynamic substrate coupled ESD protection circuit of this invention.

FIGS. 7 and 8 illustrate the structure of the second embodiment of the dynamic substrate coupled ESD protection circuit for explanation of the method for fabricating the substrate coupled ESD protection circuit of this invention. An N-type material is diffused into the surface of a P-type semiconductor substrate 400 to form the N-type well 700. A field oxide isolation 405 is formed to demarcate the area of the whole dynamic substrate coupled ESD protection and the area of the N-type well 700.

N-type material is diffused into the surface of the semiconductor substrate to form the source region 425 and the drain region 420 of the N-MOS transistor M$_n$ 300 and a low resistance contact pad 715 to the N-type well 700. A P+ type material is then diffused into the surface of the semiconductor substrate 400 to form the drain region 720 and the source region 725 of the P-MOS transistor M$_p$ 600 and the low resistance contact pad 415 to the P-type substrate 400.

A gate oxide is formed between the drain region 420 and the source region 425 of the N-MOS transistor 300 and between the drain region 720 and the source region 725 of the P-MOS transistor 600. A conductive material such as polycrystalline silicon is formed on the gate to create the gates 430 and 730 of the N-MOS transistor M$_n$ 300 and the P-MOS transistor M$_p$ 600.

The conductive material will also be formed on the top surface of the field oxide 405 to form the first plates of the first and second coupling capacitors C$_{cn}$ 310 and C$_{cp}$ 610. The insulators of the first and second coupling capacitor C$_{cn}$ 310 and C$_{cp}$ 610 are the field oxide isolation 405. The second plate of the coupling capacitor C$_{cn}$ 310 is the P-substrate 400 and the second plate of the second coupling capacitor C$_{cp}$ 610 is the N-type well 700.

The input/output contact pad is connected to the first plates of the first and second coupling capacitor C$_{cn}$ 310 and C$_{cp}$ 610 and to the drains of the N-MOS transistor M$_n$ 300 and the P-MOS transistor M$_p$ 600. The low resistance contact pad 415 diffused into the P-substrate 400 is connected to the first terminal of the first resistor R$_n$ 320. The second terminal of the first resistor R$_n$ 320 is connected to the ground reference point. The low resistance contact pad 715 diffused into the N-type well 700 is connected to the first terminal of the second resistor R$_p$ 620. The second terminal of the second resistor R$_p$ 620 is connected to the power supply voltage source V$_{DD}$.

The gate electrode 435 and source region 425 of the N-MOS M$_n$ 300 are connected to the ground reference point. The gate electrode 735 and source region 725 of the P-MOS M$_p$ 600 are connected to the power supply voltage source V$_{DD}$.

Figure 5:
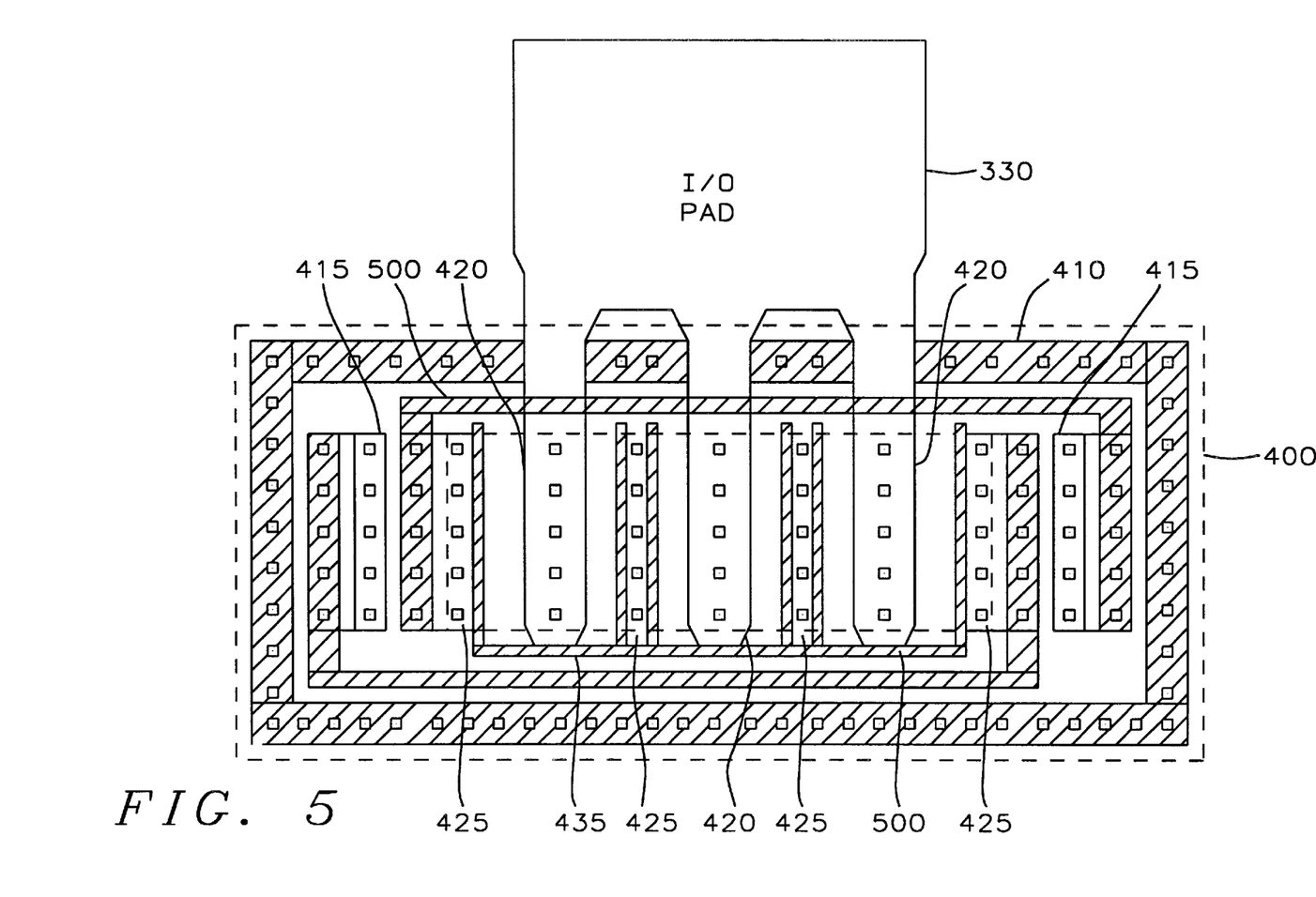
FIG. 5 is a top surface plan view of the first embodiment of the dynamic substrate coupled ESD protection circuit of this invention.

The first resistor R$_n$ 320 is formed by the polycrystalline sections 500. The second resistor R$_p$ 620 is formed by the polycrystalline sections 800.

It will be apparent to those skilled in the art that aspect of this invention such as the ground reference point can be changed to a negative power supply voltage source. Further, the conductivity type of the substrate and the diffusions can be changed to opposite conductivity types and still be in keeping with the intent of this invention.

While this invention has been particularly shown and described with reference to the preferred embodiments thereof, it will be understood by those skilled in the art that various changes in form and details may be made without departing from the spirit and scope of the invention.

The invention claimed is:

1. A method for forming a dynamic substrate coupled electrostatic discharge ESD protection circuit on a surface of a semiconductor substrate comprising the steps of:

providing a semiconductor substrate of a first conductivity type;

forming a field oxide area outlining an area defining the dynamic substrate coupled ESD protection circuit upon said substrate;

diffusing a material of a second conductivity type into the surface of the semiconductor substrate to form a drain region and a source region of a MOS transistor of the dynamic substrate coupled ESD protection circuit;

diffusing a material of the first conductivity type into the surface of the semiconductor substrate to create a contact point to form a low resistivity path to said semiconductor substrate;

forming a gate oxide on the surface of the semiconductor substrate;

forming a gate electrode of said MOS transistor on said gate oxide between the drain region and the source region of said MOS transistor;

forming a first plate of a coupling capacitor on a top surface of the field oxide area, whereby said coupling capacitor has an insulator formed of said field oxide area and a second plate formed of the semiconductor substrate;

forming polysilicon sections between the contact point to the semiconductor substrate and a power supply voltage source to form a resistor between said second plate and said power supply voltage source;

connecting a contact pad that is connected to internal circuitry formed on said semiconductor substrate to the first plate of the coupling capacitor and the drain region of the MOS transistor; and connecting the gate electrode and the source region of the MOS transistor to the power supply voltage source.

2. The method of claim 1 wherein when an ESD voltage is applied to the contact pad, said ESD voltage is coupled through the coupling capacitor to lower a snapback voltage of the MOS transistor by activating a parasitic bipolar device of said MOS transistor more quickly.

3. The method of claim 1 wherein the capacitor has the coupling capacitance of approximately 0.06 pf.

4. The method of claim 1 wherein the resistor has a resistance of approximately 80K ohms.

5. A method for forming a dynamic substrate coupled electrostatic discharge ESD protection circuit on a surface of a semiconductor substrate comprising the steps of:

providing a semiconductor substrate of a first conductivity type;

diffusing a material of a second conductivity type into the surface of a semiconductor substrate to form a well of the second conductivity type;

forming a field oxide area outlining an area defining the dynamic substrate coupled ESD protection circuit upon said substrate and surrounding said well;

diffusing a material of a second conductivity type into the surface of the semiconductor substrate to form a drain region and a source region of a first MOS transistor of the dynamic substrate coupled ESD protection circuit, and into said well to create a first contact point to form a low resistivity path to the well;

diffusing a material of the first conductivity type into the surface of the semiconductor substrate to create a contact point to form a low resistivity path to said semiconductor substrate, and to form a drain region and a source region of a second MOS transistor of the dynamic substrate coupled ESD protection circuit;

forming a gate oxide on the surface of the semiconductor substrate;

forming gate electrodes for the first and second MOS transistor on said gate oxide between the drain regions and the source of the first and second MOS transistors;

forming first plates of a first and a second coupling capacitor on a top surface of the field oxide area, whereby said first coupling capacitor has an insulator formed of said field oxide area and a second plate formed of the semiconductor substrate, and second coupling capacitor has an insulator formed of said field oxide area and a second plate formed of the well;

forming first polysilicon sections between the contact point to the semiconductor substrate and a first power supply voltage source to form a first resistor between said second plate of the first coupling capacitor and said first power supply voltage source;

forming second polysilicon sections between the contact point to the well and a second power supply voltage source to form a second resistor between said second plate of the second coupling capacitor and said second power supply voltage source;

connecting a contact pad that is connected to internal circuitry formed on said semiconductor substrate to the first plates of the first and second coupling capacitors and the drain regions of the first and second MOS transistors;

connecting the gate electrode and the source region of the first MOS transistor to the first power supply voltage source; and connecting the gate electrode and the source region of the second MOS transistor to the second power supply voltage source.

6. The method of claim 5 wherein when an ESD voltage of a first polarity is applied to the contact pad, said ESD voltage is coupled through the first capacitor to lower a snapback voltage of the first MOS transistor by activating a first parasitic bipolar device of said first MOS transistor more quickly.

7. The method of claim 5 wherein when an ESD voltage of a second polarity is applied to the contact pad, said ESD voltage is coupled through the second capacitor to lower a snapback voltage of the second MOS transistor by activating a second parasitic bipolar device of said second MOS transistor more quickly.

8. The method of claim 5 wherein the first and second capacitors each have a capacitance of approximately 0.06 pf.

9. The method of claim 5 wherein the first and second resistors each have a resistance of approximately 80K ohms.

* * * * *